(12) United States Patent
Krokoszinski et al.

(10) Patent No.: US 8,728,922 B2
(45) Date of Patent: May 20, 2014

(54) METHOD FOR PRODUCING MONOCRYSTALLINE N-SILICON SOLAR CELLS, AS WELL AS A SOLAR CELL PRODUCED ACCORDING TO SUCH A METHOD

(75) Inventors: Hans-Joachim Krokoszinski, Nussloch (DE); Jan Lossen, Erfurt (DE)

(73) Assignee: SolarWorld Industries-Thueringen GmbH, Bonn (DE)

( * ) Notice: Subject to any disclaimer, the term of this patent is extended or adjusted under 35 U.S.C. 154(b) by 860 days.

(21) Appl. No.: 12/735,751

(22) PCT Filed: Feb. 11, 2009

(86) PCT No.: PCT/EP2009/051569
§ 371 (c)(1),
(2), (4) Date: Oct. 25, 2010

(87) PCT Pub. No.: WO2009/101107
PCT Pub. Date: Aug. 20, 2009

(65) Prior Publication Data
US 2011/0041902 A1  Feb. 24, 2011

(30) Foreign Application Priority Data

Feb. 15, 2008 (DE) .......... 10 2008 009 268
Mar. 10, 2008 (DE) .......... 10 2008 013 446

(51) Int. Cl.
*H01L 21/00* (2006.01)

(52) U.S. Cl.
USPC .......... 438/548; 438/83; 438/558; 438/559; 438/563; 257/E25.007; 136/256

(58) Field of Classification Search
USPC .......... 438/83, 548, 558, 559, 563; 257/E25.007; 136/256
See application file for complete search history.

(56) References Cited

U.S. PATENT DOCUMENTS

| | | | |
|---|---|---|---|
| 5,609,775 A * | 3/1997 | Liu | 438/625 |
| 5,641,362 A * | 6/1997 | Meier | 136/256 |
| 6,262,359 B1 * | 7/2001 | Meier et al. | 136/256 |
| 6,593,224 B1 * | 7/2003 | Lin | 438/618 |

(Continued)

FOREIGN PATENT DOCUMENTS

| | | |
|---|---|---|
| CN | 1348607 | 5/2002 |
| EP | 0 776 051 | 5/1997 |

(Continued)

OTHER PUBLICATIONS

Salami, J. : Cruz, B. ; Shaikh, A : "Diffusion Paste Development for Printable IBC and Bifacial Silicon Solar Cells"; Conference Record of the 2006 IEEE 4TH World Conference on Photovoltaic Energy Conversion, vol. 2, May 2006, pp. 1323-1325, XP002533732.

(Continued)

*Primary Examiner* — Kimberly Rizkallah
*Assistant Examiner* — Maria Ligai
(74) *Attorney, Agent, or Firm* — Kenyon & Kenyon LLP

(57) ABSTRACT

A method for producing monocrystalline n-silicon solar cells having a rear-side passivated $p^+$ emitter and rear-side, spatially separate heavily doped $n^{++}$-base regions near the surface, as well as an interdigitated rear-side contact finger structure, which is in conductive connection with the $p^+$-emitter regions and the $n^{++}$-base regions. An aluminum thin layer or an aluminum-containing thin layer is first deposited on the rear side of the n-silicon wafer, and the thin layer is subsequently structured so that openings are obtained in the region of the future base contacts. In a further process step, the aluminum is then diffused into the n-silicon wafer in order to form a structured emitter layer.

24 Claims, 18 Drawing Sheets

(56) References Cited

U.S. PATENT DOCUMENTS

| | | | |
|---|---|---|---|
| 6,825,104 B2 * | 11/2004 | Horzel et al. | 438/547 |
| 6,998,288 B1 | 2/2006 | Smith et al. | |
| 7,135,350 B1 | 11/2006 | Smith et al. | |
| 7,807,556 B2 * | 10/2010 | Dunne et al. | 438/558 |
| 2002/0016016 A1 * | 2/2002 | Tsuzuki et al. | 438/57 |
| 2002/0172898 A1 * | 11/2002 | Forester | 430/328 |
| 2005/0172996 A1 | 8/2005 | Hacke et al. | |
| 2006/0148233 A1 * | 7/2006 | Datta et al. | 438/614 |
| 2006/0275936 A1 * | 12/2006 | Ribeyron et al. | 438/22 |

FOREIGN PATENT DOCUMENTS

| | | |
|---|---|---|
| EP | 0 999 598 | 5/2000 |
| JP | 2000-138386 | 5/2000 |
| JP | 2002-511190 | 4/2002 |
| JP | 2003-533029 | 11/2003 |
| JP | 2007-281044 | 10/2007 |
| WO | WO 98/50944 | 11/1998 |
| WO | WO 01/84639 | 11/2001 |

OTHER PUBLICATIONS

W.D. Mulligan, D.H. Rose, M.J. Cudzinovic, D.M. DeCeuster, K.R. McIntosh, D.D. Smith, R.M. Swanson, "Manufacture of solar cells with 21% efficiency", Proceedings of the 19th European Photovoltaic Solar Energy Conference, Paris, France (2004).

* cited by examiner

METHOD FOR PRODUCING MONOCRYSTALLINE N-SILICON SOLAR CELLS, AS WELL AS A SOLAR CELL PRODUCED ACCORDING TO SUCH A METHOD

FIELD OF THE INVENTION

The present invention relates to a method for producing monocrystalline n-silicon solar cells having a $p^+$ emitter on the rear side and spatially separate, heavily doped $n^{++}$ base regions near the surface on the rear side, as well as an interdigitated rear-side contact finger structure, which is in conductive contact with the $p^+$ emitter regions and the $n^{++}$ base regions, and it also relates to a solar cell produced according to such a method.

BACKGROUND INFORMATION

Back contact solar cells on monocrystalline n-Si wafers have been developed by different solar cell manufacturers for a number of years, and some of these cells are already available on the market.

For example, reference is made to the so-called A300 cell by SunPower (cf. W. D. Mulligan, D. H. Rose, M. J. Cudzinovic, D. M. DeCeuster, K. R. McIntosh, D. D. Smith, R. M. Swanson, "Manufacture of solar cells with 21% efficiency", Proceedings of the 19th European Photovoltaic Solar Energy Conference, Paris, France (2004)). The A300 cell is a so-called interdigitated back contact cell (IBC), which means that both the emitter and the BSF (back surface field) or base contact strips are situated on the rear side of the cell and are developed in the form of two meshing fork structures.

The required electrical separation of adjacently located n-doped and p-doped semiconductor regions on the same surface may be achieved in different ways. For example, there is the possibility of placing the two regions at different levels by removing the silicon oxide precipitated on the rear surface around the regions provided as base contacts using laser ablation (P. Engelhardt, N.-P. Harder, T. Neubert, H. Plagwitz, B. Fischer, R. Meyer and R. Brendel, "Laser Processing of 22% Efficient Back-Contacted Silicon Solar Cells", 21st European Photovoltaic Solar Energy Conference, Dresden, 2006, p. 1).

Once the surface damage caused by the laser process, and approx. 20 μm of the silicon have been removed by wet-chemical etching, the emitter doping with phosphorus into the deeper-lying regions of the rear side, the front side and the connecting holes between front emitter and rear side emitter is implemented simultaneously, with the aid of a standard $POCl_3$ process.

The metallic coating of both regions then takes place in a single aluminum vapor deposit step, the contact regions being electrically separated from each other by tearing the thin metal layer at the produced, virtually perpendicular step structure in the semiconductor surface.

Technologies for the production of passivated emitters and of local spot contacts to the two semiconductor regions of base and emitter are likewise known and acknowledged in the literature (cf. R. A. Sinton, Y. Kwark, R. M. Swanson, "Recombination Mechanisms in Silicon Solar Cells", 14th Project Integration Meeting, Photovoltaic Concentrator Technology Project, June 1986, p. 117-125).

The local opening of the passivation layer, which simultaneously is the insulation between the semiconductor regions and the superposed metallic current paths, is increasingly implemented with the aid of lasers. On the one hand, so-called laser ablation is employed for removing the insulation layer only locally. On the other hand, the so-called laser-fired contact method (LFC) is employed, in which laser flashes move the vapor-deposited or sputtered aluminum layer through the insulating layer in order to contact the semiconductor regions lying underneath.

From DE 696 31 815 T2, it is known to use an AlSi eutecticum as conductor base for the p-emitter structure, which is produced on the surface once the aluminum has diffused into the silicon through a previously inwardly diffused $n^+$ layer of the rear side. The solution there also uses screen printing of aluminum paste through oxide windows above the n-base regions. The disadvantage of this solution is that the aluminum doping and the contacting of the aluminum emitter must be implemented in one step, i.e., across a large surface, so that the surface of the emitter and the surface of the metal contacting are identical. Thus, no passivation of the emitter with local contacts is possible. This results in a large surface recombination rate and thus relatively low efficiency.

Both the laser ablation and the LFC method for the production of local contacts have the disadvantage that these methods are of sequential nature. In other words, the holes for each wafer must be produced individually, one after the other.

SUMMARY OF THE INVENTION

In view of the above, it therefore is an object of the exemplary embodiments and/or exemplary methods of the present invention to provide a further developed method for producing monocrystalline n-silicon solar cells having rear-side, passivated $p^+$ emitters and spatially separate, heavily doped $n^{++}$ base regions near the surface, as well as an interdigitated rear-side contact finger structure, which allows high productivity and avoids the disadvantages of the related art.

Furthermore, it should be possible to combine technological steps, particularly steps that cost considerable time in the production process, in order to ensure a further improvement in productivity.

Furthermore, the use of wafer-protecting technologies known from the production of microelectronics chips, such as sputtering, vapor deposition, CVD, masked dry-etching of aluminum and of oxides using different halogen plasmas, as well as ink-jetting are to be made available for the production of solar cells.

According to the exemplary embodiments and/or exemplary methods of the present invention, for the method this objective is achieved by the features described herein, and with regard to the solar cell, it is achieved by a subject matter according to the feature combination as further described herein, the further embodiments representing at least useful specific developments and further improvements.

An important aspect as to the exemplary embodiments and/or exemplary methods of the present invention is the production of a rear-side, locally diffused and passivated aluminum emitter and the possibility of carrying out simultaneous two-sided and local $n^+$ doping of n-silicon in the rear-side and front-side n-base regions near the surface. According to the exemplary embodiments and/or exemplary methods of the present invention, the diffusion steps for the emitters and the BSF or FSF region to be produced may be carried out in a common thermal treatment step for the diffusion of the selected emitter doping material of aluminum and the selected BSF/FSF dopant of phosphorus.

The wafer may already be textured on one side before the aluminum-containing starting layer for the emitter doping is deposited and structured. However, it is also quite possible to carry out the texturing of the wafer only after the aluminum has been deposited and coated with an etch-resistant oxide on the rear side, so that the emitter, and thus the largest part of the rear side, remains untextured.

As for the rest, the exemplary embodiments and/or exemplary methods of the present invention also shows the process sequence leading up to the finished rear-contacted solar cell, i.e., including the passivation of the front and back sides as well as the production of the contact structure, including the chemical or galvanic reinforcement.

Essential for the exemplary embodiments and/or exemplary methods of the present invention is also the lateral separation of the emitter and base doping materials embodied in the finished solar cell, and thus the cell production technology, which is novel for solar cells.

The basis of the method according to the present invention is the deposition of an aluminum or aluminum-containing thin layer on the rear side of the n-silicon wafer as well as the subsequent structuring of this thin layer, through which openings are obtained in the region of the future base contacts. In a further process step, the aluminum is then diffused into the n-silicon wafer in order to form a structured emitter layer. Thus, the aluminum or aluminum-containing layer is structured before being diffused into the wafer itself.

The mentioned aluminum thin layer may be deposited on the wafer by a vapor-deposition or sputter process.

The structuring of the deposited aluminum thin layer is performed in the form of strips, which may be by selective etching. Toward this end, dry-etching methods via a metal shadow mask may be employed, but the use of an organic mask is possible as well. Wet-chemical etching may of course be performed as well or selective etching using local printing of an etching paste.

In a further method step, the structured emitter layer is covered by a dielectric protective layer across the entire surface. Furthermore, this protective layer is opened up in future base doping regions, which may again be realized by etching or with the aid of an etching mask.

Then, the silicon wafer is subjected to texturing, which takes place on the front side of the wafer and in the region of the openings in the dielectric protective layer.

These openings may be formed via a strip-etching mask, the width of the produced openings being smaller than the width of the strip-shaped regions in the aluminum-free wafer.

Material having high phosphorus content is deposited in the region of the openings in the dielectric protective layer in order to produce the heavily doped $n^{++}$ BSF base regions near the surface.

This deposition may also be implemented by applying a paste using screen printing or stencil printing, by ink-jetting in local deposits or by similar methods.

If necessary, the applied paste is subjected to a drying step.

The BSF doping material is then diffused in a thermal treatment step consisting of one step or multiple steps.

The diffusing of the aluminum as emitter dopant and the diffusing of the BSF doping material may be performed in a common treatment step in an especially economic process.

A flat phosphorus diffusion layer (FSF—front surface field) on the front side of the wafer in the region of the openings in the dielectric protective layer may be produced by an additional thermal treatment in a phosphorus-containing atmosphere, in particular a $POCl_3$ atmosphere, which has a layer resistance that is adjustable via the treatment temperature and the treatment time.

With the aid of an etch bath, residual doping material, produced phosphorus silicate glass, residue from the insulation layer as well as produced AlSi eutecticum layers are removed, so that the emitter regions, the BSF region, and the possibly existing front-side $n^+$-FSF structure are exposed.

Subsequently, the wafer is covered by a passivation layer, e.g., a silicon oxide layer. The passivation layer is then locally removed in the emitter regions and the BSF regions on the rear side of the wafer. The entire rear side of the wafer is then covered by a conductive layer, especially an aluminum layer. This conductive layer is used to form the interdigitated contact-finger structure.

A new type of solar cell is obtained as a result of the briefly outlined method, the $n^{++}$ base regions on the wafer's rear side having a lateral clearance from the $p^+$-emitter regions, and at least the $n^{++}$-base regions having a concentration of the emitter doping material that lies below the n-base concentration of the initial wafer.

The exemplary embodiments and/or exemplary methods of the present invention will be explained in greater detail in the following text with the aid of an exemplary embodiment, using schematic illustrations of the individual process steps.

BRIEF DESCRIPTION OF THE DRAWINGS

FIG. 2 shows aluminum-containing layer 3 is brought into contact with a shadow mask 5a.

DETAILED DESCRIPTION

Figure 1:
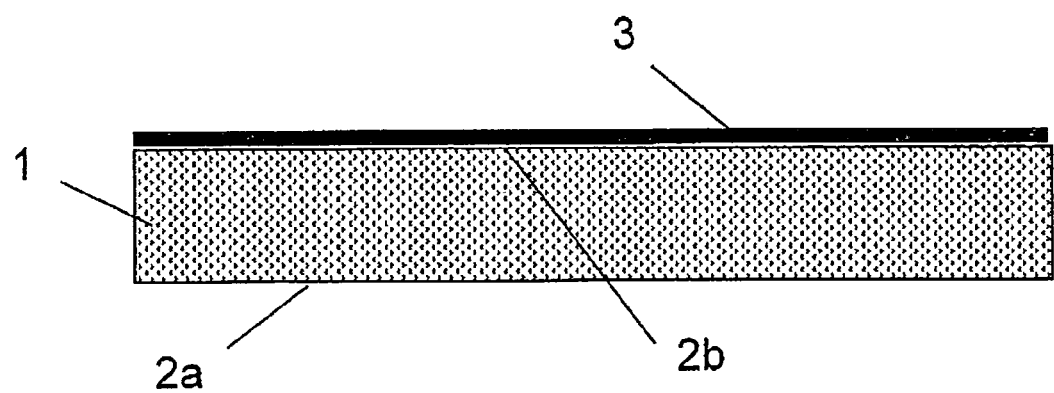
FIG. 1 shows in a first method step, an entire rear side 2b of n-silicon wafer 1, which is untextured in the illustrated example, is covered by an aluminum or aluminum-containing layer 3, which forms the emitter dopant.

In a first method step according to FIG. 1, entire rear side 2b of n-silicon wafer 1, which is untextured in the illustrated example, is covered by an aluminum or aluminum-containing layer 3, which forms the emitter dopant. The front side of the wafer is denoted by reference numeral 2a, and the rear side by reference numeral 2b.

Figure 2:
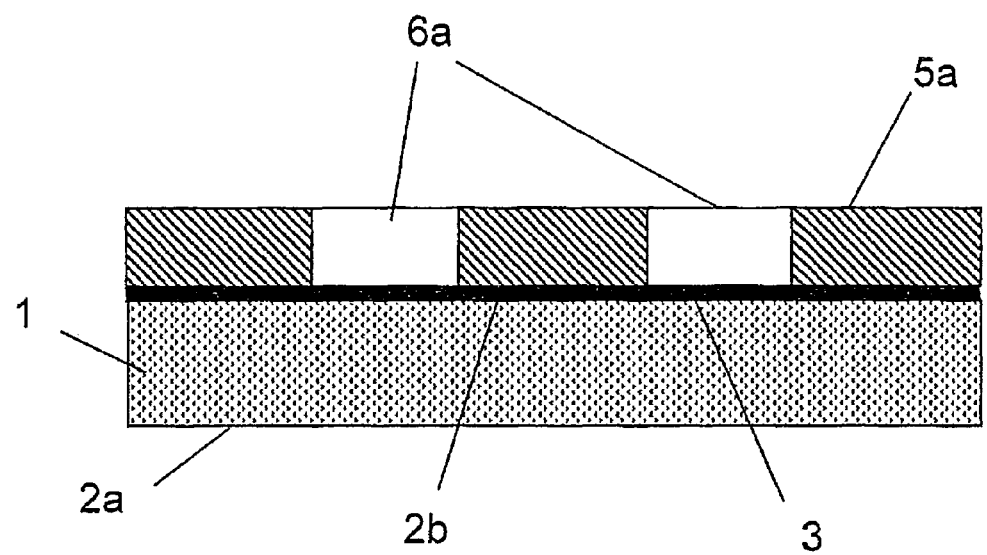
Figure 3:
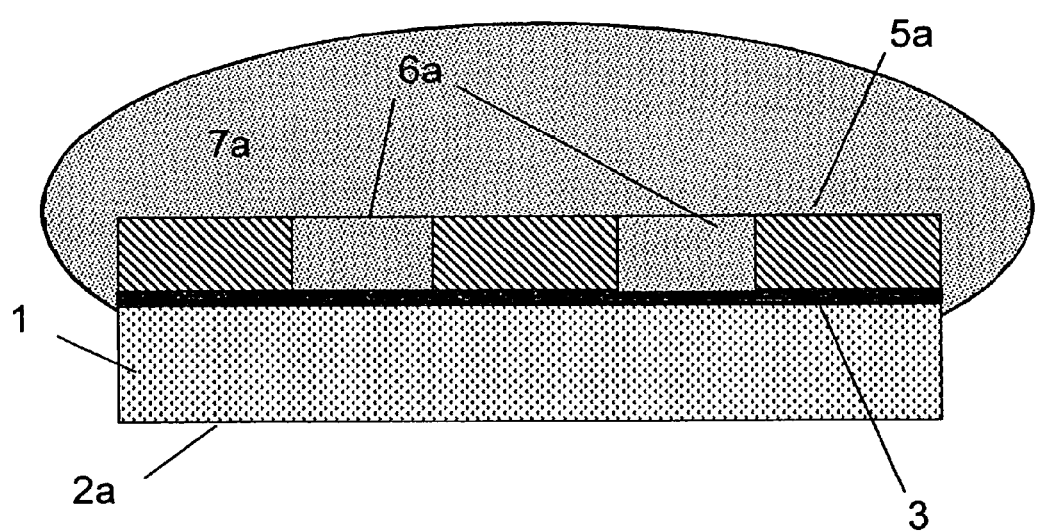
FIG. 3 shows a dry-etching step in plasma 7a containing chlorine gas.

In a further step, aluminum-containing layer 3 is brought into contact with a shadow mask 5a and structured by a dry-etching step in plasma 7a containing chlorine gas (cf. FIGS. 2 and 3).

As an alternative, an organic mask layer may be applied as well, e.g., by so-called ink-jetting, and the aluminum in the regions that have remained free then be etched in a wet-chemical manner.

The two discussed technological variants produce longitudinal openings 4 in the form of strips in the region of breakthroughs 6a of mask 5a.

At a later point, the BSF doping material is diffused into strip-shaped openings 4 in aluminum layer 3 at a lateral distance to the aluminum edge.

Figure 4:
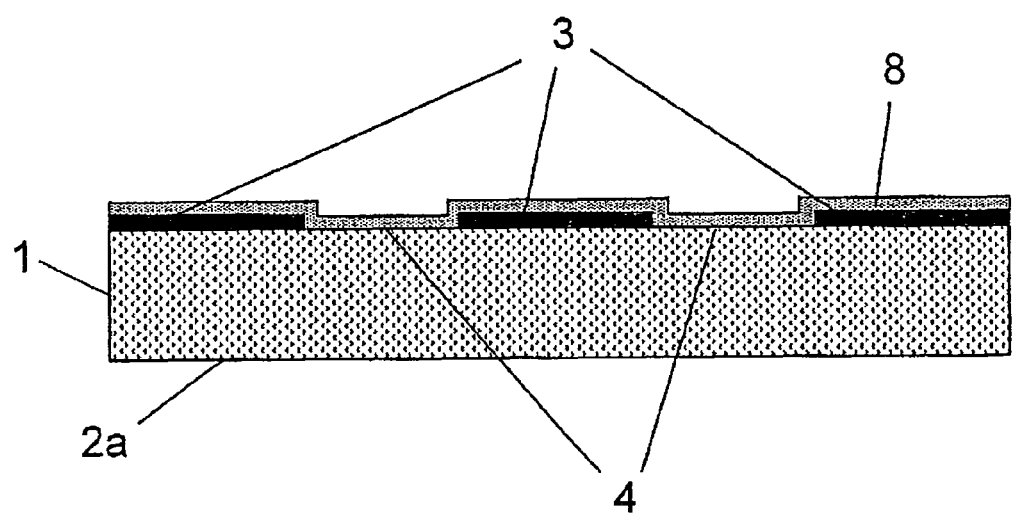
FIG. 4 shows a further process step according to the present invention that pertains to the coating of the strip-shaped, structured, aluminum-containing layer 3 by a dielectric layer 8.

A further process step according to the exemplary embodiments and/or exemplary methods of the present invention then pertains to the coating of the strip-shaped, structured, aluminum-containing layer 3 by a dielectric layer 8 (cf. FIG. 4). Dielectric layer 8 may be made from an oxide, e.g., $SiO_2$, $TiO_2$, or $Al_2O_3$.

It is also possible to form a silicon nitride layer, which likewise is impermeable to phosphorus diffusion. The deposition of layer 8 may be performed by reactive sputtering or by a CVD- or PECVD method.

Figure 5:
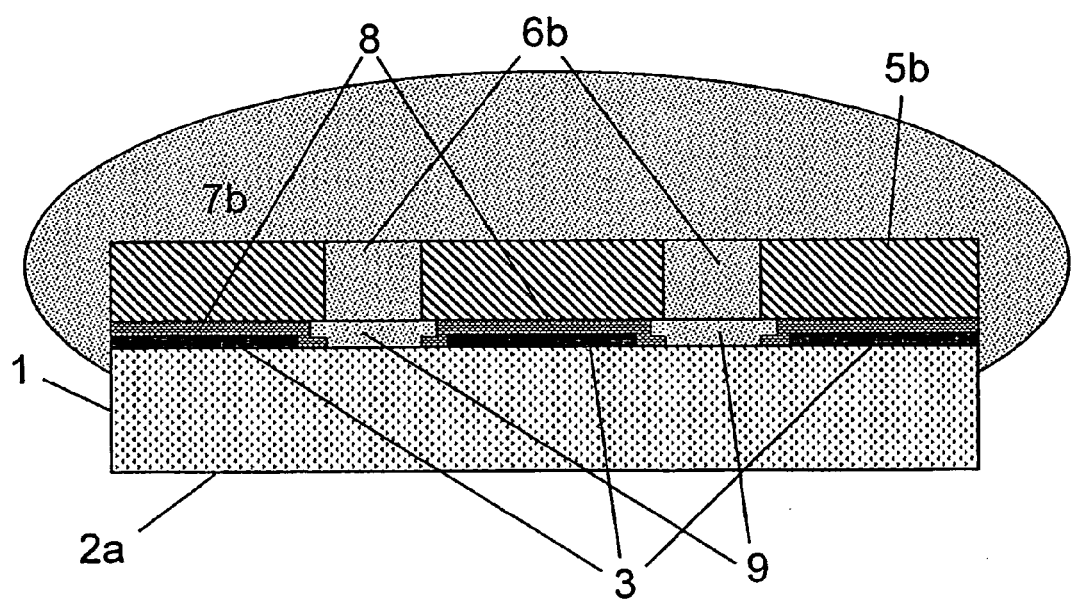
FIG. 5 shows, in a further method step, dielectric layer 8 is then removed by a masked etching step in the region of openings 6b of an additional mask 5b.

In a further method step, dielectric layer 8 is then removed by a masked etching step in the region of openings 6b of an additional mask 5b according to FIG. 5.

This may be a dry-etching step in a plasma 7b containing fluorine gas, penetrating a metal foil mask, or by a dry-etching step in a plasma atmosphere containing fluorine gas, penetrating an organic mask layer, or a wet-chemical etching process, penetrating an organic mask layer.

According to the exemplary embodiments and/or exemplary methods of the present invention, the strip-shaped openings 6b in mask 5b and the resulting strip-shaped regions 9 exposed in dielectric layer 8 are smaller than the strip-shaped openings 6a in mask 5a, and thus in aluminum-containing layer 3.

This prevents the occurrence of a short-circuit between the emitter regions and the BSF regions during the phosphorus doping in the next process step.

Figure 6:
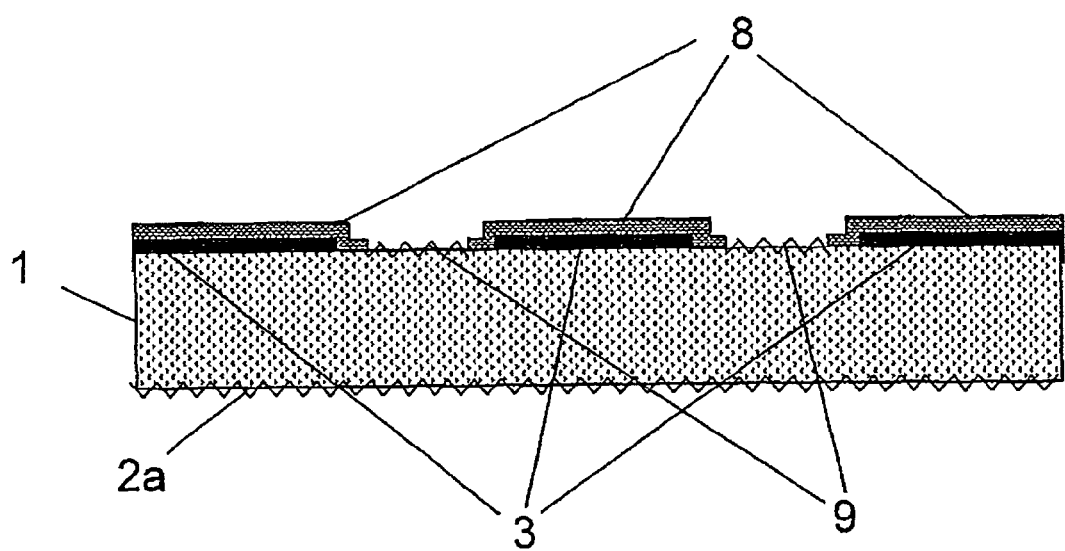
FIG. 6 shows standard-type texturing is then implemented by dipping in a bath of KOH and isopropyl alcohol (IPA).
Figure 7:
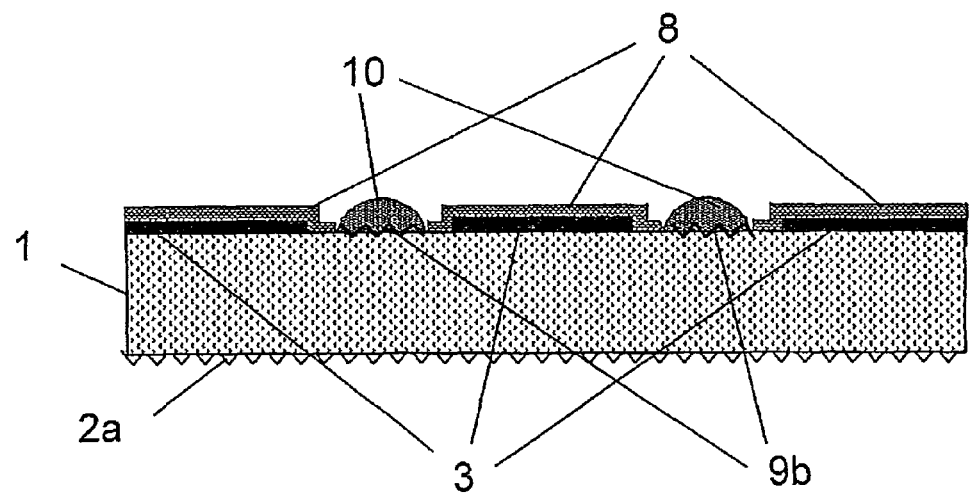
FIG. 7 and FIG. 8 show a first thermal treatment step takes place at temperatures ranging from 900° C. to 1100° C. in a nitrogen-oxygen mixture, which causes the desired co-diffusion.

According to the illustration in FIG. 6, standard-type texturing is then implemented by dipping in a bath of KOH and isopropyl alcohol (IPA), for example. Since aluminum-containing layer 3 is protected by dielectric layer 8, the texturing in the desired manner takes place only on front side 2a of the wafer and in the exposed strip-shaped regions 9b on the rear side of the wafer.

Subsequently, openings 9 in cover layer 8 in the openings of emitter layer 4 are covered by a material having a large phosphorus component, which may be a paste, which is able to be deposited on the surface of wafer 1 in local deposits 10 by screen printing, stencil printing or ink-jetting, for example. If necessary, this paste is subjected to a drying step at temperatures of 150° C. to 200° C., for example.

Figure 8:
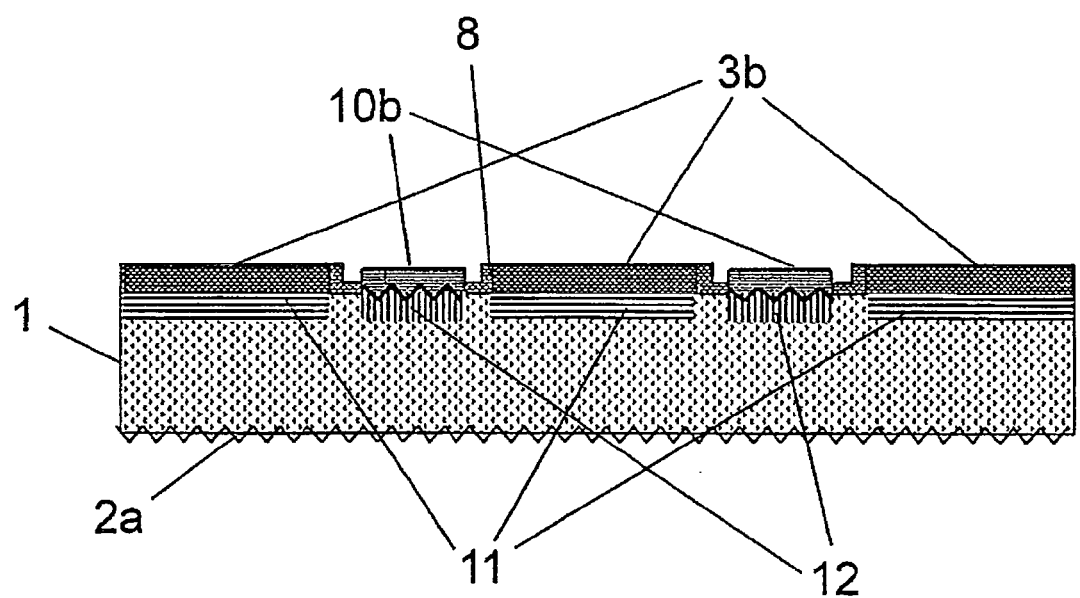
Figure 9:
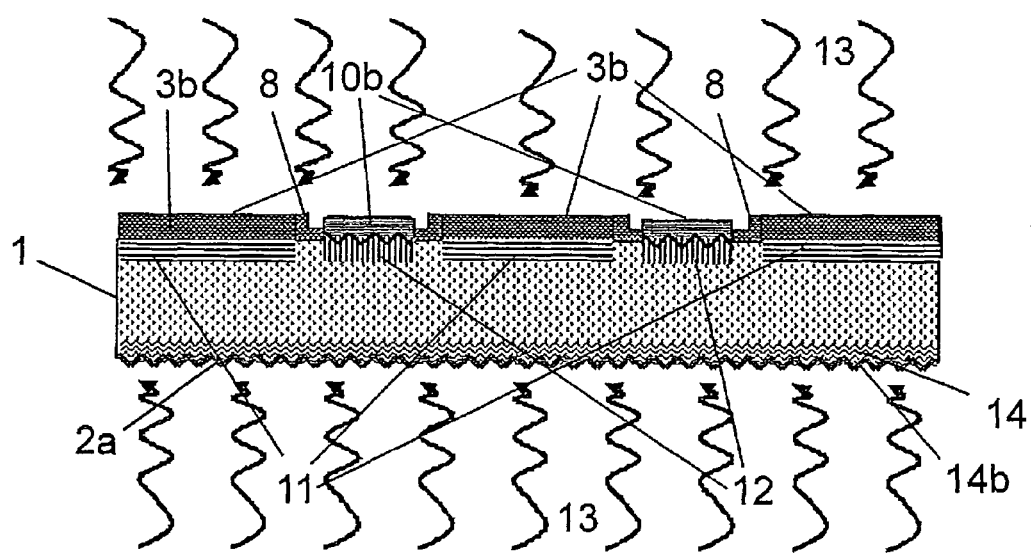
FIG. 9 shows an optional second thermal treatment step at said usually lower temperatures, only this time using the $POCl_3$ atmosphere.

According to the illustrations in FIGS. 8 and 9, a one-step, or optionally a two-step, thermal treatment takes place with the possibility of a co-diffusion of the emitter dopant aluminum and the BSF doping material phosphorus from the dried, phosphorus-containing layer 10b.

A first thermal treatment step takes place at temperatures ranging from 900° C. to 1100° C. in a nitrogen-oxygen mixture, which causes the desired co-diffusion (FIG. 8). A second treatment step optionally takes place at temperatures between 800° C. and 1000° C., i.e., in a phosphorus-containing gas 13, which may be $POCl_3$.

The first high-temperature step causes an interdiffusion of silicon and aluminum and leads to a near-surface, mixed crystal layer 3b having an eutectic AlSi structure and the $p^+$-doping layer with Al profile 11.

At the same time, the phosphorus from precursor deposit 10b diffuses into BSF regions 9b, into the silicon surface, and leads to a deep $n^{++}$ doping 12.

Due to the high temperatures of >1000° C. required for the aluminum diffusion, the diffusion profile of the phosphorus has a deeper characteristic than in P-diffusion processes around 900° C. that are otherwise the norm.

The optional second thermal treatment step at said usually lower temperatures, only this time using the $POCl_3$ atmosphere according to FIG. 9, brings about not only the deep P-diffusion in the BSF regions of rear side 9b, but additionally a flat P-diffusion on front side 2a, which forms an FSF layer (front surface field) 14 having a layer resistance that is adjustable via the temperature and time, i.e., which may be high layer resistance.

Of course, the first thermal treatment step may also be performed prior to the step of coating with the phosphorus-containing paste and independently of the subsequent second thermal treatment step. In this case one advantage results from the fact that the process parameters of the second diffusion step at a lower temperature are able to be optimized, regardless of the process parameters of the first diffusion step at a higher temperature.

In the same way, the additional flat diffusion in the phosphorus-containing gas atmosphere, which may be by using $POCl_3$, may also be omitted if no front surface field layer 14 is desired as front-side passivation. On the other hand, this passivation could also be performed in an additional third diffusion process, in particular if the first phosphorus diffusion step has also been realized using $POCl_3$.

Figure 10:
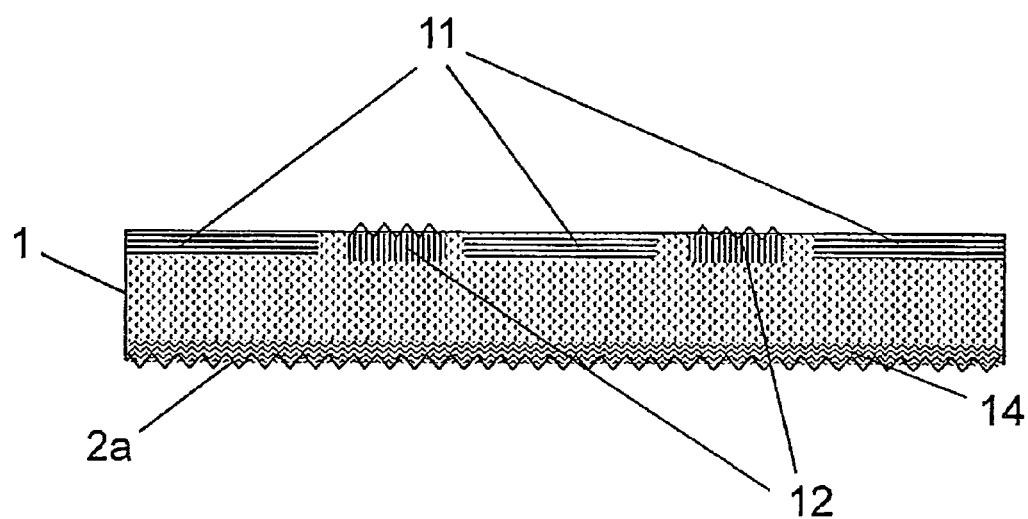
FIG. 10 shows, in the following further course of the process, the residues of doping paste 10b, produced phosphorus silicate glass PSG 14b, dielectric masking layer 8, and AlSi eutectic layer 3b are etched off in suitable etch baths, so that emitter regions 11, BSF region 12, and front-side $n^+$ layer 14 are exposed.

In the following further course of the process, the residues of doping paste 10b, produced phosphorus silicate glass PSG 14b, dielectric masking layer 8, and AlSi eutectic layer 3b are etched off in suitable etch baths, so that emitter regions 11, BSF region 12, and front-side n+ layer 14 are exposed, i.e., according to FIG. 10.

Figure 11:
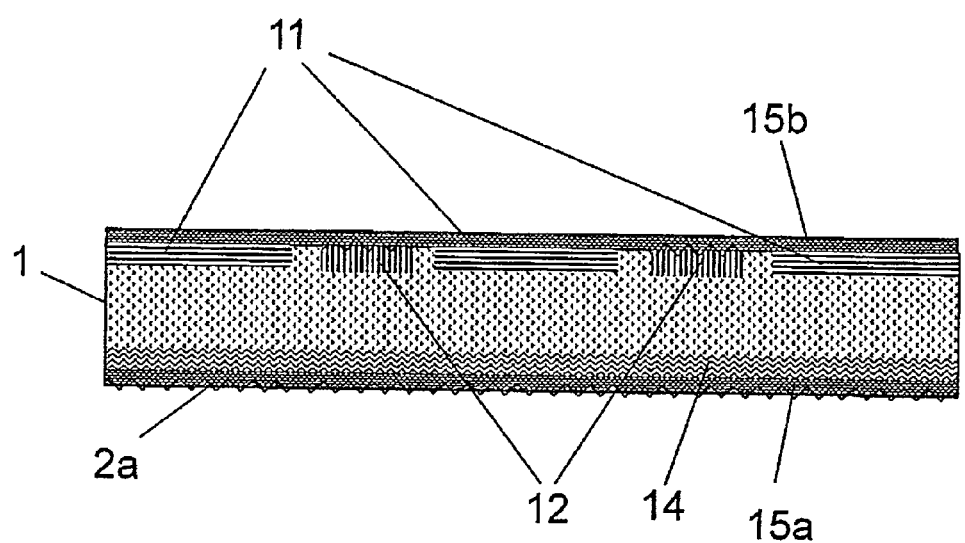
FIG. 11 shows both sides are coated by a dielectric in a further method step, e.g., by thermal oxidation of both sides of the wafer in a water vapor atmosphere, so that a silicon oxide layer results on front side 15a and rear side 15b.

As illustrated in FIG. 11, both sides are coated by a dielectric in a further method step, e.g., by thermal oxidation of both sides of the wafer in a water vapor atmosphere, so that a silicon oxide layer results on front side 15a and rear side 15b.

Figure 12:
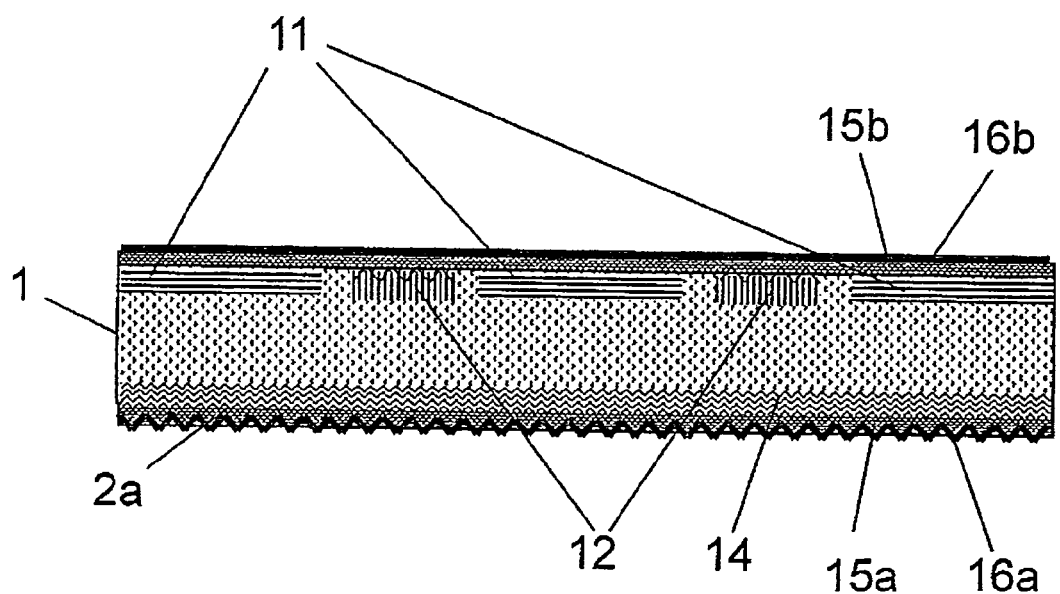
FIG. 12 shows that the annealing process realized in the manner described leads to excellent surface-passivation results.

Optionally, it is possible to coat both sides with a thin aluminum layer once a thermal oxide has formed on both wafer surfaces. The layer thickness may amount to a range between 10 nm and 100 nm. An aluminum layer 16a subsequently results on the front side, and an aluminum layer 16b on the rear side. The wafers, coated in this way, are then subjected to a thermal treatment at a range between 350° C. and 450° C. The annealing process realized in this manner leads to excellent surface-passivation results (cf. FIG. 12).

When the aluminum layer has been etched off, the wafer is once again in a state as shown in FIG. 11.

Figure 13:
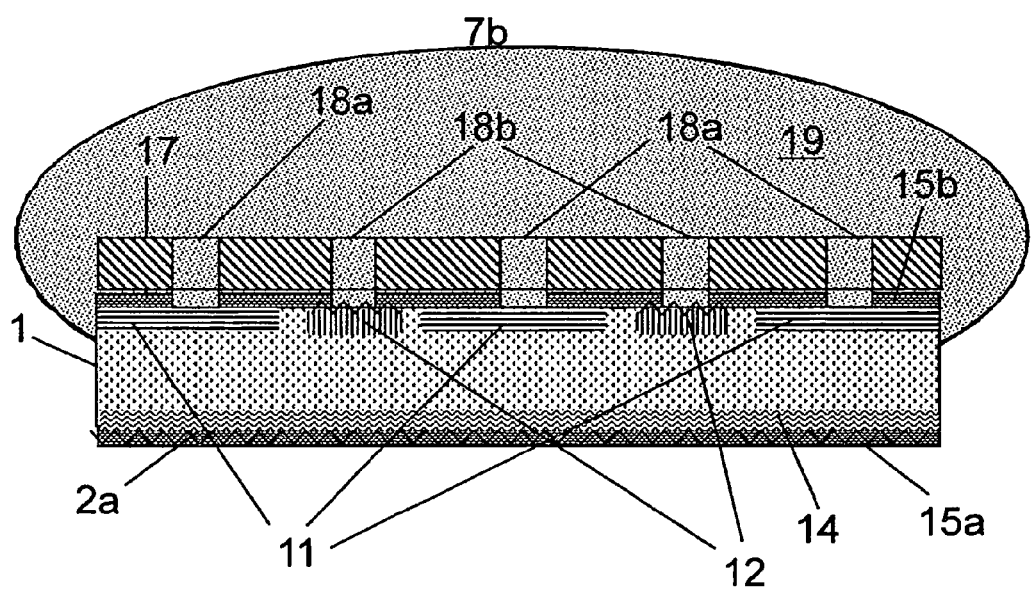
FIG. 13 shows passivation layer 15b is locally removed on the rear side in all emitter and BSF regions, i.e., simultaneously by masked dry etching in a plasma 7b containing fluorine gas, or without masking by laser ablation, for instance.

Furthermore, as shown in FIG. 13, passivation layer 15b is locally removed on the rear side in all emitter and BSF regions, i.e., simultaneously by masked dry etching in a plasma 7b containing fluorine gas, or without masking by laser ablation, for instance. In the same way, the generally known LFC method may be used once the base metal coating has been deposited.

Openings 18a above emitter regions 11, and openings 18b above the BSF regions in mask 17 are smaller than openings 6b in mask 5b of the preceding etching step.

For one, this facilitates the adjustment of the shadow mask or mask layer 17 on the already existing structure; for another, the contact regions of the metallization to the semiconductor material are to be small, if possible, in order to restrict the surface recombination.

Figure 14:
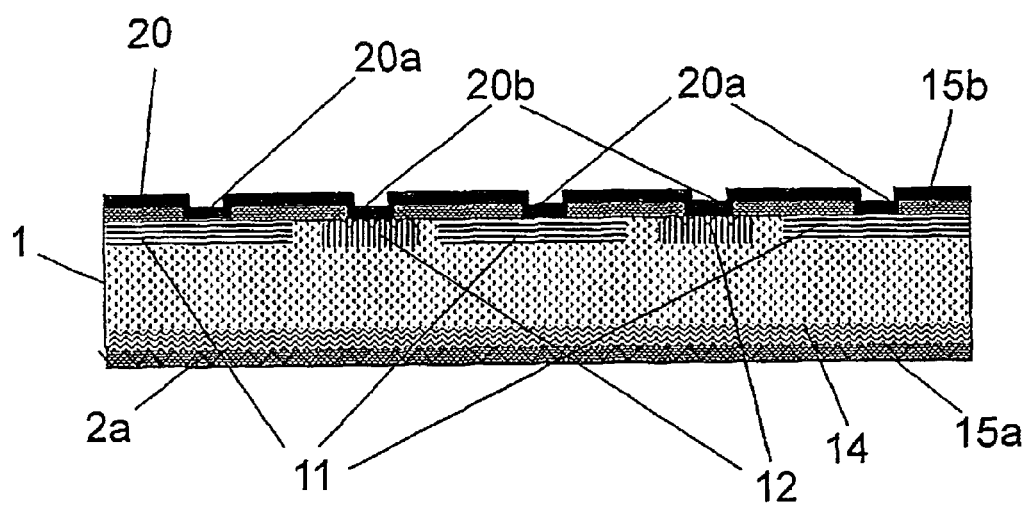
FIG. 14 shows, in the following process step, the entire rear side is covered by an aluminum layer 20, so that all contact surfaces 20a and 20b exposed in the preceding etching step are metalized, but otherwise are insulated from the semiconductor regions emitter 11 and BSF 12 by layer 15b.

In the following process step, the entire rear side is covered by an aluminum layer 20, so that all contact surfaces 20a and 20b exposed in the preceding etching step are metalized, but otherwise are insulated from the semiconductor regions emitter 11 and BSF 12 by layer 15b (cf. FIG. 14).

Figure 15:
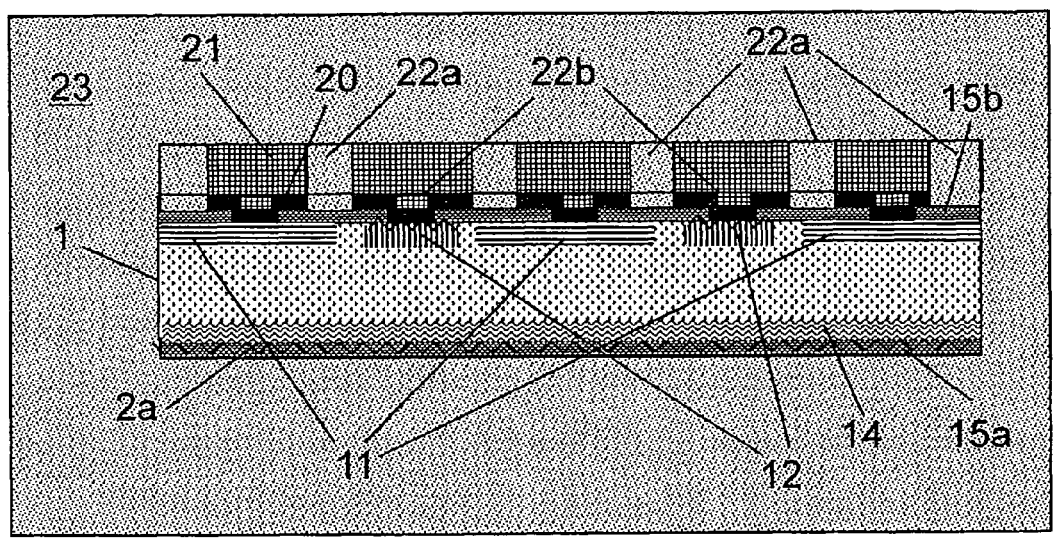
FIG. 15 shows that by applying an acid-resistant layer 21, which may be by structured inkjet-printing, aluminum layer 20 is then subdivided into emitter contact traces and BSF contact traces, and this application is performed so that narrow interspaces 22a between planned contact regions 22b are left free, in which the aluminum is removed by an acid 23 that etches aluminum selectively, that is to say, does not attack silicon oxide.

By applying an acid-resistant layer 21, which may be by structured inkjet-printing, aluminum layer 20 is then subdivided into emitter contact traces and BSF contact traces. This application is performed in such a way that narrow interspaces 22a between planned contact regions 22b are left free, in which the aluminum is removed by an acid 23 that etches aluminum selectively, that is to say, does not attack silicon oxide (cf. FIG. 15). During the inkjet printing, either an organic paste is used which dries on the surface, or a hot-melt wax is used, which is injected while warm and then solidifies on the wafer while cooling. Another possibility is the use of suitable ink, which is subjected to a drying process.

Figure 16:
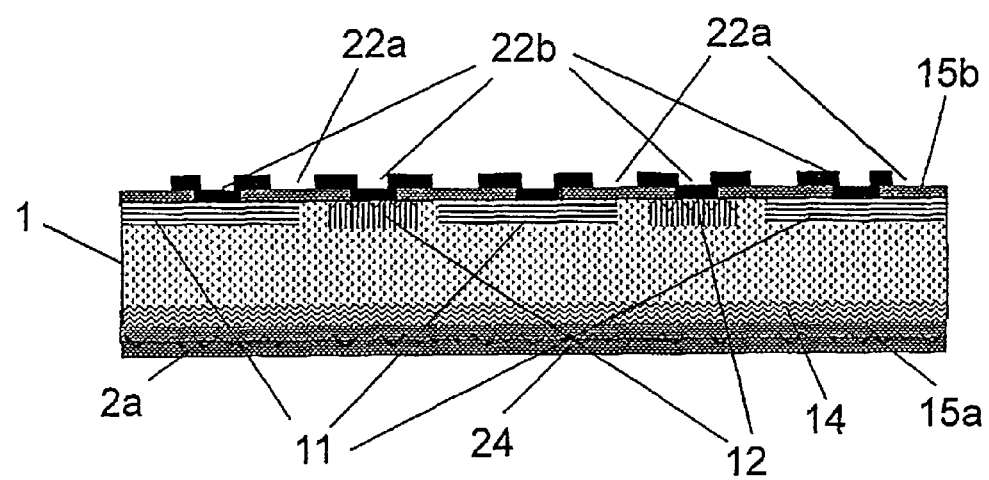
FIG. 16 shows, in a supplementary process step, an antireflection layer 24, which may be of silicon nitride, is formed on the front side.

In a supplementary process step, as shown in FIG. 16, an anti-reflection layer 24, which may be of silicon nitride, is formed on the front side. With regard to thickness and refractive index, this anti-reflection layer is developed with a view toward optimum efficiency with respect to trapping energy from sunlight. Plasma-aided CVD or reactive sputtering, for instance, may be used to deposit this anti-reflection layer 24.

It is preferred if the plasma CVD method is used for this purpose because it takes place at temperatures above 400° C. yet below 500° C. and therefore causes annealing of aluminum contact layer 20 and thus a reduction in the contact resistance, without risking an AlSi liquefaction at the eutectic temperature of 577° C.

Figure 17:
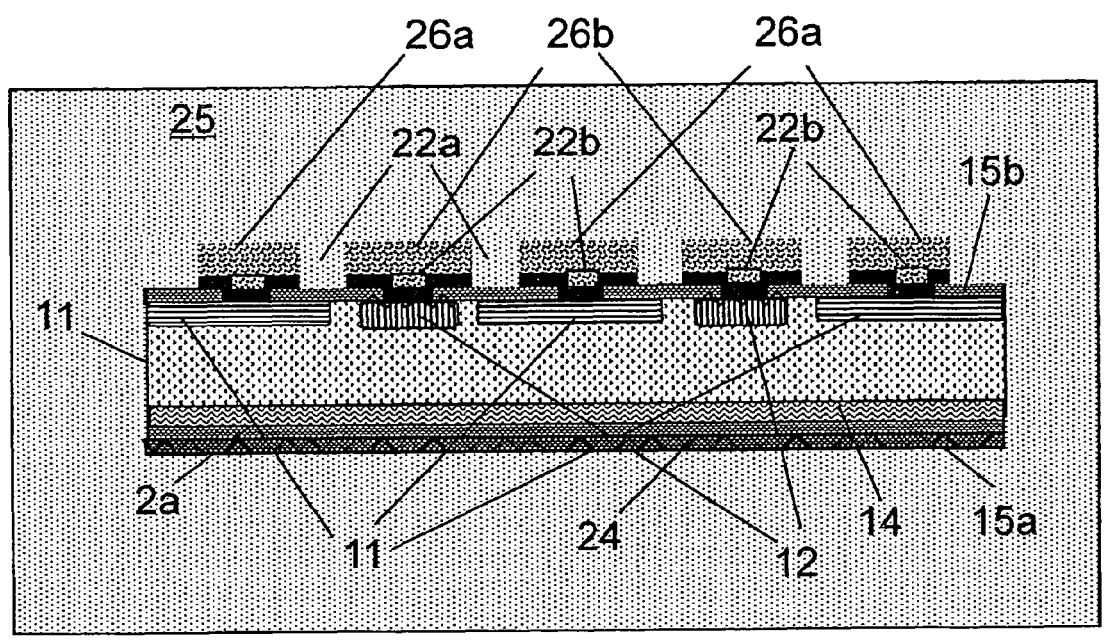
FIG. 17 shows all contacts on the rear side may simultaneously and additionally be provided with a thick metallic conductive layer in a chemical or galvanic bath 25 or with the aid of a possibly light-based deposition process.

According to FIG. 17, all contacts on the rear side may simultaneously and additionally be provided with a thick metallic conductive layer in a chemical or galvanic bath 25 or with the aid of a possibly light-based deposition process. This results in the production of emitter circuit trace reinforcements 26a or BSF circuit trace reinforcements 26b. The individual layers may either consist of a single material of nickel, copper or silver, or of a plurality of individual layers of different metals, such as Ni+Cu+Sn or Ni+Ag or Ni+Au, for example.

Figure 18:
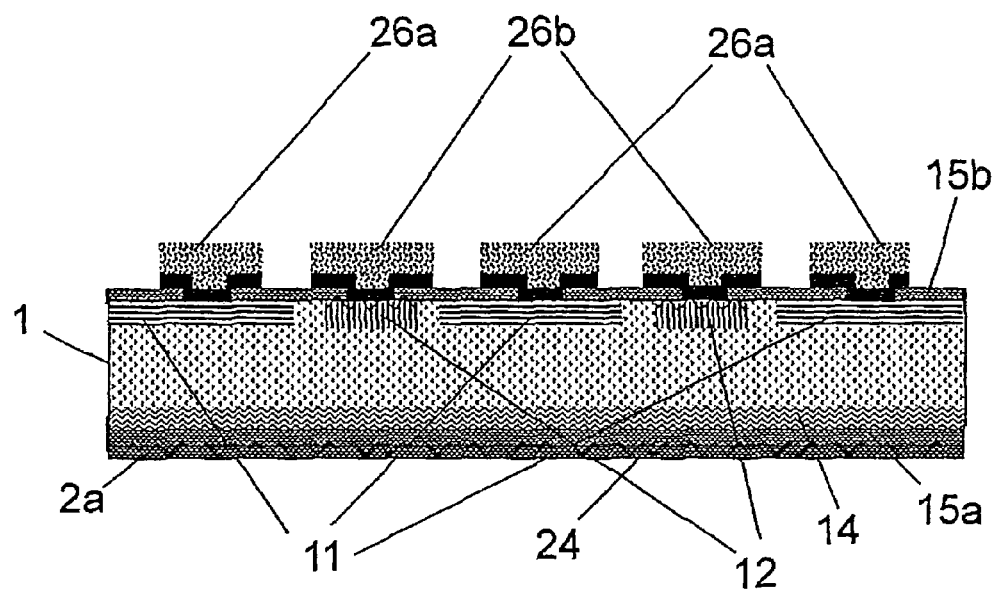
FIG. 18 shows, after rinsing and drying the wafer, the back-contacted solar cell is functional.

After rinsing and drying the wafer, the back-contacted solar cell is functional, as shown in FIG. 18. An edge insulation is not required since the lateral clearance and the oxide cover ensure the separation of emitter regions 11 and BSF regions.

The invention claimed is:

1. A method for producing at least one monocrystalline n-silicon solar cell, the method comprising:
depositing a thin layer, formed of one of aluminum and an aluminum-containing material, on a rear-side of an n-silicon wafer;
subsequently structuring the thin layer by removing selected portions of the thin layer to define $p^+$-emitter regions that correspond to non-removed portions, the removed portions forming openings that correspond to $n^{++}$-base regions depositing an insulating layer over the thin layer;
subsequently depositing a doping material for the $n^{++}$-base regions into the openings; and
diffusing the aluminum from the thin layer into the n-silicon wafer in a further process to form a structured emitter layer;
wherein:
the diffusion of the aluminum as emitter dopant and a diffusion of the doping material for the $n^{++}$-base regions occurs in a common treatment operation; and
the $p^+$-emitter regions and the $n^{++}$-base regions are spatially separated on the rear-side of the n-silicon wafer, near the surface, and an interdigitated rear-side contact finger structure is in conductive connection with the $p^+$-emitter regions and the $n^{++}$-base regions.

2. The method of claim 1, wherein the thin layer is deposited by one of a vapor deposit process and a sputter process.

3. The method of claim 1, wherein the structuring of the deposited thin layer is performed in the form of strips by selective etching.

4. The method of claim 3, wherein dry-etching is performed using a metal shadow mask.

5. The method of claim 3, wherein dry-etching is performed using an organic mask.

6. The method of claim 3, wherein the etching is performed in a wet-chemical manner using an organic ink mask.

7. The method of claim 3, wherein the selective etching is performed by local printing of an etching paste.

8. The method of claim 1, wherein residue of the existing thin layer is removed once the aluminum diffusion step has been completed.

9. The method of claim 1, wherein the structured emitter layer is covered by a dielectric protective layer across the full surface, and wherein the dielectric protective layer is opened up in the regions of the future base contacts.

10. The method of claim 9, wherein the openings are formed in regions of the future base doping, with the aid of an etching mask.

11. The method of claim 10, wherein the openings are formed via a strip-mask, and wherein the width of the produced openings are smaller than the width of the aluminum-free, strip-shaped regions in the wafer.

12. The method of claim 9, wherein the silicon wafer is subjected to texturation.

13. A method for producing at least one monocrystalline n-silicon solar cell, the method comprising:
  depositing a thin layer formed of one of aluminum and an aluminum-containing material, on a rear-side of an n-silicon wafer;
  subsequently structuring the thin layer so that openings in a region of a future base doping are obtained; and
  diffusing the aluminum from the thin layer into the n-silicon wafer in a further process to form a structured emitter layer;
  wherein:
    the at least one monocrystalline n-silicon solar cell includes:
      rear-side $p^+$-emitter regions;
      rear-side, spatially separate heavily doped $n^{++}$-base regions near the surface; and
      an interdigitated rear-side contact finger structure, which is in conductive connection with the $p^+$-emitter regions and the $n^{++}$-base regions;
    the structured emitter layer is covered by a dielectric protective layer across the full surface;
    the dielectric protective layer is opened up in the regions of the future base contacts; and
    the silicon wafer is subjected to texturation that takes place on the front side of the wafer and in the region of the openings in the dielectric protective layer.

14. The method of claim 13, wherein material having a high phosphorus content is deposited in the region of the openings in the dielectric protective layer to produce the heavily doped $n^{++}$-base regions as back surface field (BSF) regions located near the surface.

15. The method of claim 14, wherein the deposition is implemented by applying a paste using one of screen printing, stencil printing, and ink jetting in local deposits.

16. The method of claim 15, wherein the deposited paste is subjected to a drying operation.

17. The method of claim 14, wherein the doping material for the $n^{++}$-base regions is diffused in a thermal treatment operation having at least one step.

18. The method of claim 17, wherein a further thermal treatment in a phosphorus-containing atmosphere, which includes $POCl_3$, occurs to produce a flat phosphorus diffusion layer (FSF—front surface field) on the front side of the wafer featuring a layer resistance that is adjustable by the treatment temperature and the treatment time.

19. A method for producing at least one monocrystalline n-silicon solar cell, the at least one monocrystalline n-silicon solar cell comprising rear-side $p^+$-emitter regions, rear-side, spatially separate heavily doped $n^{++}$-base regions near a surface, and an interdigitated rear-side contact finger structure, which is in conductive connection with the $p^+$-emitter regions and the $n^{++}$-base regions, the method comprising:
  depositing a thin layer formed of one of aluminum and an aluminum-containing material, on a rear-side of an n-silicon wafer;
  subsequently structuring the thin layer so that openings in a region of a future base doping are obtained;
  diffusing the aluminum from the thin layer into the n-silicon wafer in a further process to form a structured emitter layer; and
  exposing the $p^+$-emitter regions and the $n^{++}$-base regions by removing the following using an etch bath: a residual doping material, a produced phosphorus silicate glass, residues of an insulation layer, and a produced AlSi eutecticum layer material.

20. The method of claim 19, wherein the wafer is covered by at least one passivation layer.

21. The method of claim 20, wherein the rear side of the wafer is locally freed of the passivation layer in the $p^+$-emitter regions and the $n^{++}$-base regions to form local contact points.

22. The method of claim 21, wherein the entire rear side of the wafer is covered by a conductive layer, which includes an aluminum layer.

23. The method of claim 22, wherein the conductive layer is structured to form the interdigitated contact fingers.

24. The method of claim 19, wherein the diffusion of the aluminum as emitter dopant and the diffusion of the doping material for the $n^{++}$-base regions occurs in a common treatment operation.

* * * * *